(12) United States Patent
Chen et al.

(10) Patent No.: US 8,953,730 B2
(45) Date of Patent: Feb. 10, 2015

(54) AUTO FREQUENCY CALIBRATION FOR A PHASE LOCKED LOOP AND METHOD OF USE

(75) Inventors: Yen-Jen Chen, Taipei (TW); Feng Wei Kuo, Zhudong Township (TW); Huan-Neng Chen, Taichung (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 135 days.

(21) Appl. No.: 13/452,138

(22) Filed: Apr. 20, 2012

(65) Prior Publication Data

US 2013/0278303 A1    Oct. 24, 2013

(51) Int. Cl.
*H03D 3/24*    (2006.01)

(52) U.S. Cl.
USPC ............................ 375/376; 375/373; 327/156

(58) Field of Classification Search
CPC ... H03L 2207/50; H03L 7/1976; H03L 7/104; H03L 7/101
USPC ........... 375/376, 219, 295, 365; 327/156, 157
See application file for complete search history.

(56) References Cited

U.S. PATENT DOCUMENTS

| | | | |
|---|---|---|---|
| 6,545,547 B2* | 4/2003 | Fridi et al. | 331/16 |
| 7,064,591 B1* | 6/2006 | Humphreys et al. | 327/156 |
| 7,295,077 B2* | 11/2007 | Thomsen et al. | 331/10 |
| 7,512,390 B2* | 3/2009 | Lee et al. | 455/260 |
| 7,692,500 B1* | 4/2010 | Koukab et al. | 331/17 |
| 7,804,367 B2* | 9/2010 | Lee et al. | 331/16 |
| 7,876,136 B2* | 1/2011 | Ha et al. | 327/157 |
| 8,008,956 B1* | 8/2011 | Shin et al. | 327/157 |
| 8,120,394 B2* | 2/2012 | Tarng et al. | 327/156 |
| 2003/0197564 A1* | 10/2003 | Humphreys et al. | 331/11 |
| 2008/0048791 A1* | 2/2008 | Fahim | 331/1 A |
| 2010/0173598 A1* | 7/2010 | Kavadias et al. | 455/226.1 |
| 2010/0213984 A1* | 8/2010 | Shin et al. | 327/105 |
| 2011/0090998 A1* | 4/2011 | Zhang | 375/365 |
| 2012/0119839 A1* | 5/2012 | Takahashi et al. | 331/36 C |

OTHER PUBLICATIONS

Lei Lu, Zhichao Gong, Youchun Liao, Hao Min, Zhangwen Tang, "A 975-to-19601V Hz Fast-Locking Fractional-N I~ Synthesizer with Adaptive Bandwidth Control and s 4/4.5 Prescaler for Digital TV Tuners", 2009, IEEE International Solid-State Circuits Conference, Ed. 23.4, pp. 396-398.*

(Continued)

*Primary Examiner* — Daniel Washburn
*Assistant Examiner* — Berhanu Tadese
(74) *Attorney, Agent, or Firm* — Lowe Hauptman & Ham, LLP (57) ABSTRACT

A phase locked loop includes a phase difference detector configured to receive a reference frequency and a divider frequency and output a phase difference signal. The phase locked loop includes a code generator configured to receive the reference frequency and the phase difference signal, and output a coarse tuning signal and a reset signal. The phase locked loop includes a digital loop filter configured to receive the phase difference signal and output a fine tuning signal. The phase locked loop includes a voltage control oscillator configured to receive the coarse and fine tuning signals, and output an output frequency. The phase locked loop includes a divider configured to receive the reset signal, a divider number control signal and the output frequency, and output the divider frequency. The phase locked loop includes a delta-sigma modulator configured to receive a divisor ratio and the reset signal, and output divider number control signal.

20 Claims, 5 Drawing Sheets

(56) References Cited

OTHER PUBLICATIONS

Lu et al. (A 975-to-1960MHz Fast-Locking Fractional-N Synthesizer with Adaptive Bandwidth Control and 4/4.5 Prescaler for Digital TV Tuners, 2009 IEEE).*

Shin et al. "A Fast and High-Precision VCO Frequency Calibration Technique for Wideband [delta][sigma] Fractional-N Frequency Synthesizers", IEEE Transactions on Circuits and Systems—I: Regular Papers, vol. 57, No. 7, pp. 1573-1582, Jul. 2010.*

"A 975-TO-1960MHZ Fast-Locking Fractional-N Synthesizer With Adaptive Bandwidth Control and 4/4,5 Prescaler for Digital TV Tuners", 2009 IEEE.*

Saadat, M. R., et al., "Simulation and Improvement of Two Digital Adaptive Frequency Calibration Techniques for Fast Locking Wide-Band Frequency Synthesizers", IEEE 2007, pp. 136-141.

Lu, Lei, et al., "A 975-to-1960MHZ Fast-Locking Fractional-N Synthesizer with Adaptive Bandwidth Control and 4/4.5 Prescaler for Digital TV Tuners", ISSCC 2009/ Session 23/PLLs and Clocks/23.4, pp. 396-398.

\* cited by examiner

AUTO FREQUENCY CALIBRATION FOR A PHASE LOCKED LOOP AND METHOD OF USE

BACKGROUND

A phase locked loop (PLL) is used to synchronize signals. PLLs are used in radio transceivers, telecommunications, clock multipliers, microprocessors and other devices which use synchronized signals. PLLs are used to synchronize the signals of two separate devices. As technology advances, a wider range of frequencies is used to synchronize separate devices. Also, as chip switching speed increases, a faster locking time for synchronizing signals of the two separate devices is desired. However, prior PLL designs exhibit a slow locking time, increased power consumption or increased chip size.

Prior techniques for using a PLL to lock two signals together in synchronization include wide-range digital logic quadricorrelator (WDLQ) based systems. WDLQ based systems have a long processing time, resulting in a slow locking time in comparison with other techniques. A counter based system exhibits a faster locking time than the WDLQ based system, but requires the inclusion of a high frequency clock and a counter which increases power consumption and chip size.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
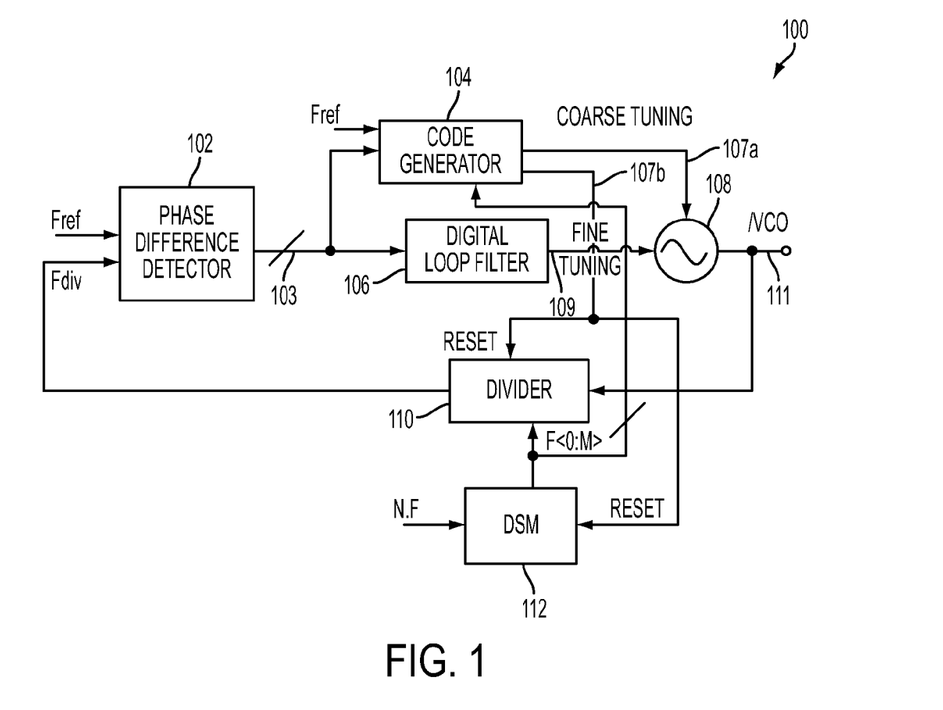
FIG. 1 is a functional block diagram of a phase locked loop (PLL) including auto frequency calibration, according to one or more embodiments.

FIG. 1 is a functional block diagram of a phase locked loop (PLL) 100. In some embodiments, PLL 100 is an all digital PLL (ADPLL). PLL circuit 100 includes a phase difference detector 102 configured to receive a reference frequency Fref and a divider frequency Fdiv. Phase difference detector 102 outputs a phase difference signal 103. A code generator 104 is configured to receive the phase difference signal 103, the reference frequency Fref and a sampling period number 105 (see FIG. 2). Code generator 104 outputs a coarse tuning signal 107a and a reset signal 107b. A digital loop filter 106 is configured to also receive the phase difference signal 103. Digital loop filter 106 outputs a fine tuning signal 109. A voltage controlled oscillator (VCO) 108 is configured to receive the coarse tuning signal 107a and the fine tuning signal 109. VCO 108 outputs an output frequency signal 111 to external circuitry. A divider 110 is configured to also receive a feedback of the output frequency signal 111. Divider 110 is also configured to receive the reset signal 107b as well as divider number control signal (N<4:0> and F<0:19>). Divider 110 outputs the divider frequency Fdiv which is received by phase difference detector 102. A delta-sigma modulator 112 is configured to receive a divisor ratio signal N.F and the reset signal 107b, where N is an integer portion of the divisor ratio signal and F is a fractional portion of the divisor ratio signal.

Phase difference detector 102 is configured to receive the reference frequency Fref and the divider frequency Fdiv and output the phase difference signal 103. In some embodiments, phase difference detector 102 comprises a time-to-digital converter (TDC). The TDC converts pulses into a digital representation of the time indices of the pulses. The TDC does not account for a magnitude of the pulses. In some embodiments, phase difference detector 102 comprising a time-to-current converter (TCC) and an analog-to-digital converter (ADC). The TCC converts pulses into an analog current signal of the time indices of the pulses. The ADC converts the analog current signal to a digital signal. The combination of the TCC and ADC is capable of accounting for a magnitude of the pulses of the reference frequency Fref, to help reduce erroneous pulse detection resulting from signal noise. In some embodiments, phase difference detector 102 compares a rising edge of the reference frequency Fref with a rising edge of the divider frequency Fdiv. In instances where the rising edge of the reference frequency Fref occurs before the rising edge of the divider frequency Fdiv, the reference frequency is said to be leading the divider frequency. The phase difference signal 103 is a positive value when the reference frequency Fref is leading the divider frequency Fdiv. In instances where the rising edge of the divider frequency Fdiv occurs before the rising edge of the reference frequency Fref, the divider frequency is said to be leading the reference frequency. The phase difference signal 103 is a negative value when the divider frequency Fdiv is leading the reference frequency Fref.

Figure 2:
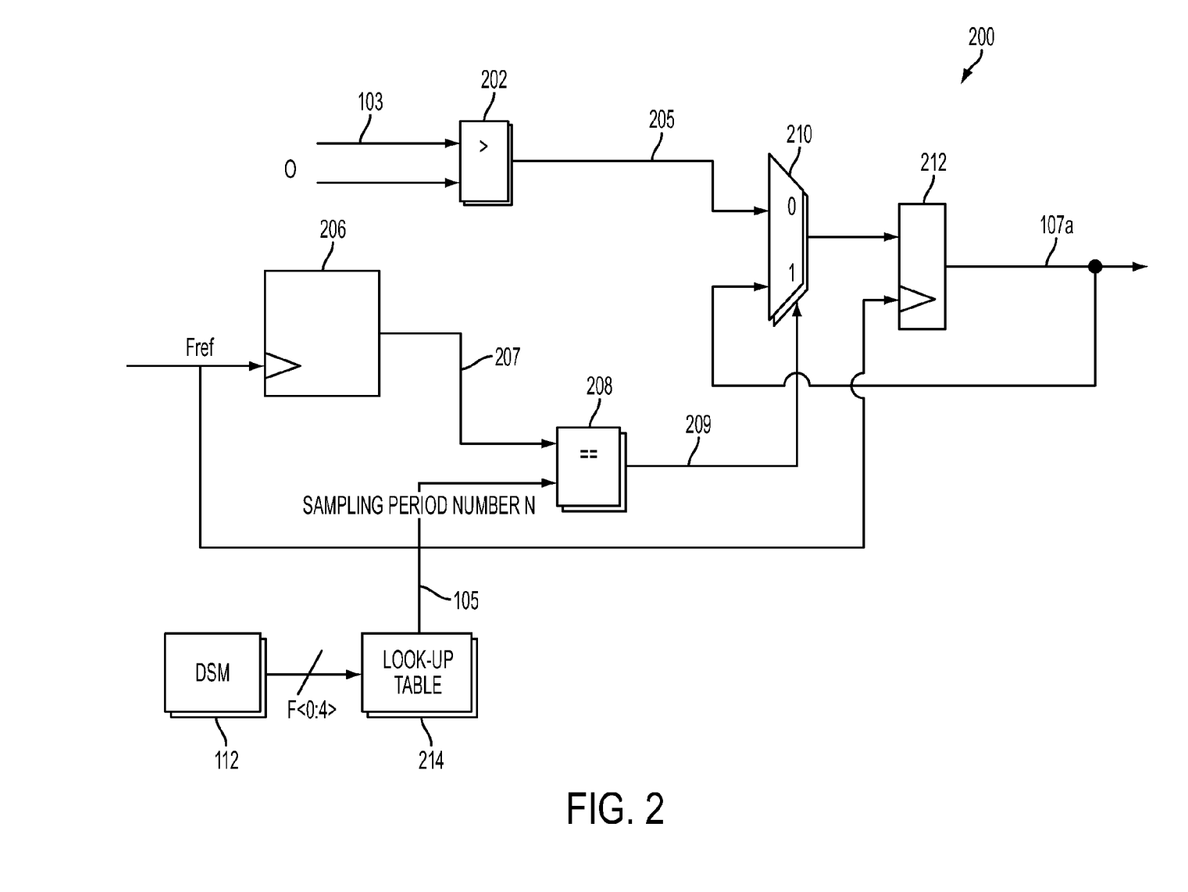
FIG. 2 is a block diagram of a code generator of a PLL, according to one or more embodiments.

Code generator 104 is configured to receive the phase difference signal 103, the reference frequency Fref and the sampling period number 105 (see FIG. 2). FIG. 2 is a block diagram of a code generator 200 (e.g. code generator 104). Code generator 200 includes a first comparator 202 configured to compare the phase difference signal 103 to a base-line signal. In some embodiments, the base-line signal is equal to a zero logic level signal.

A counter 206 is configured to receive the reference frequency Fref and output a counter signal 207. A second comparator 208 is configured to receive the counter signal 207 and the sampling period number 105. Second comparator 208 outputs a control signal 209. The control signal 209 is a high logic value if the sampling period signal number 105 is equal to the counter signal 207. The sample signal 209 is a low logic value if the sampling period number 105 is not equal to the counter signal 207. A multiplexer 210 is configured to receive the comparison signal 205, the coarse tuning signal 107a and the control signal 209. The sample signal 209 acts as a selector for first multiplexer 204. A register 212 is configured to receive the reference frequency Fref and an output of multiplexer 210. Register 212 outputs the coarse tuning signal 107a. A look-up table 214 is configured to provide the sampling period number 105 based on the fractional portion of the divisor ratio signal received from delta-sigma modulator 112.

First comparator 202 is configured to compare the phase difference signal 103 to the base-line signal. The output from first comparator 202 is a high logic level if the phase difference signal 103 is greater than the base-line signal, i.e., a positive value. The output from first comparator 202 is a low logic level if the phase difference signal 103 is not greater than the base-line signal, i.e., a negative value.

Counter 206 is configured to receive the reference frequency Fref and output the counter signal 207. Counter 206 is configured to count cycle numbers of the reference frequency Fref. In some embodiments, counter 206 counts the cycle numbers using a rising edge of the reference frequency Fref. In some embodiments, counter 206 comprises a flip-flop. Counter 206 is also configured to receive the reset signal 107b. When counter 206 receives the reset signal 107b, the cycle number in counter 206 is reset to zero.

Second comparator 208 is configured to receive the counter signal 207 and the sampling period number 105. Second comparator 208 is configured to determine whether a sampling period number 105 is equal to the counter signal 207. In some embodiments, a value of the sampling period number is determined on by five most significant bits (MSBs) of the fractional portion of the divisor ratio signal received from delta-sigma modulator 112. The control signal 209 is a high logic value if the counter signal 207 and the sampling period are equal. The control signal 209 is a low logic value if the counter signal 207 and the sampling period number are not equal.

Figure 3:
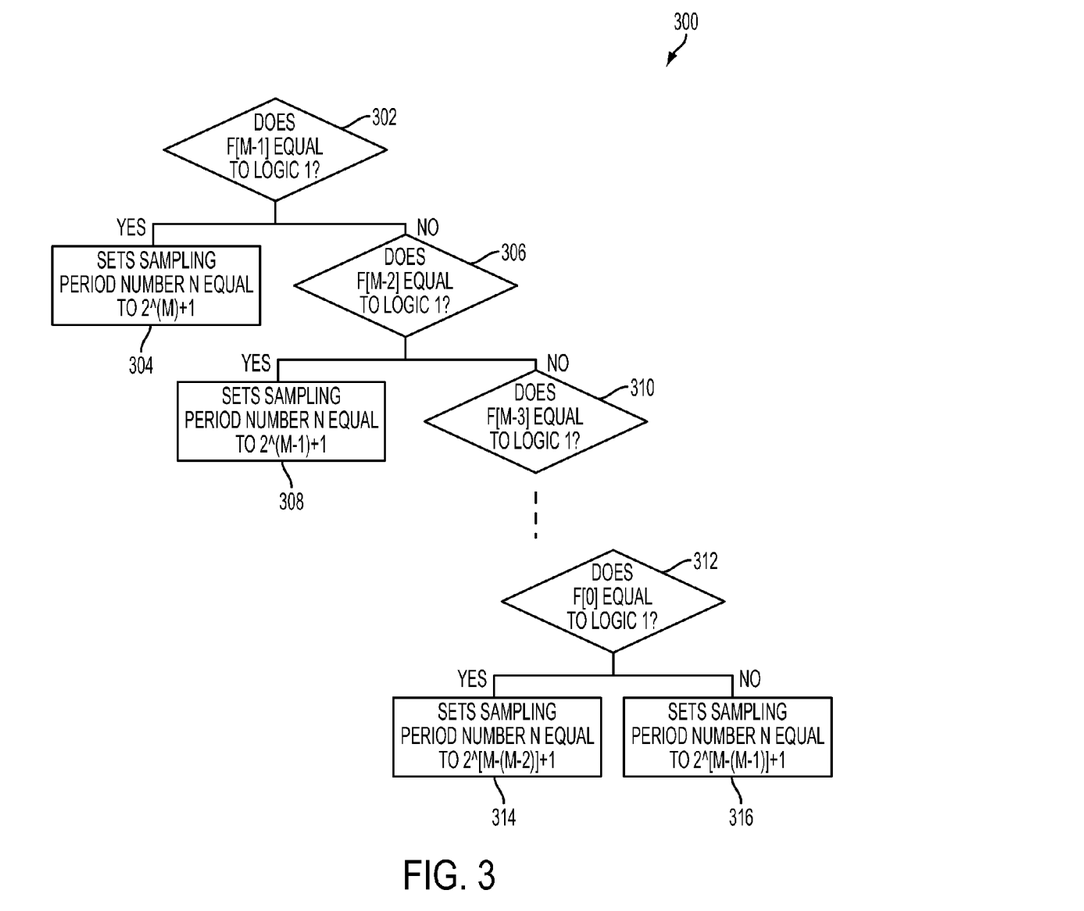
FIG. 3 is a flow chart for a determination of a period number used by a code generator, according to one or more embodiments.

FIG. 3 is a flow chart of a decision tree 300 for determining the value of the sampling number 105 based on the divider number control signal F<0:4>, which is the fractional portion of the divisor ratio signal received from delta-sigma modulator 112. Look-up table 214 is configured to receive the fractional portion of the divisor ratio. Based on a number of most significant bits (MSBs) of the fractional portion of the divisor ratio, look-up table 214 determines the value of the sampling period. In some embodiments, the number of MSBs is five. In some embodiments, the number of MSBs is greater than or less than five. The value of the sampling period is determined by t which has a value other than zero, starting with the least significant bit of the number of MSBs. For example, where F[0]-F[4] are the five MSBs of the, F[4] is examined first in determining the value of the sampling period.

In operation 302, look-up table 214 determines if F[M−1]=1, where M is the number of MSBs. In operation 304, if F[M−1]=1, then the sampling period N is set to $2^M+1$. In operation 306, if F[M−1]=0, then look-up table 214 determines if the next bit, F[M−2], has a value. In operation 308, if F[M−2]=1, then the sampling period N is set to $2^{(M-1)}+1$. In operation 310, if F[M−2]=0, the look-up table 214 examines the next bit. The process continues until bit F[0] is examined. In operation 312, look-up table 214 determines if F[0]=1. In operation 314, if F[0]=1, then the sampling period N is set to five. In operation 316, if F[0]=0, then the sampling period N is set to three.

Returning to FIG. 2, multiplexer 210 is configured to receive the comparison signal 205, the coarse tuning signal 107a and the control signal 209. The control signal 209 acts as the selector for multiplexer 210. Multiplexer 210 outputs the comparison signal 205 if the control signal 209 has a high logic value. Multiplexer 210 outputs the coarse tuning signal 107a if the control signal 209 has a low logic value. Multiplexer 210 uses the control signal 209 to control timing of changes to the coarse tuning signal 107a. In some embodiments, the coarse tuning signal 107a changes only if the counter signal 207 is equal to the sampling period.

Register 212 is configured to receive the reference frequency Fref and the coarse tuning signal 107a. Register 212 outputs the coarse tuning signal 107a based on the rising edge of the reference frequency Fref. In some embodiments, register 212 comprises a flip-flop. The coarse tuning signal 107a is used to either increase or decrease the frequency of the output frequency signal 111 from VCO 108.

Figure 4:
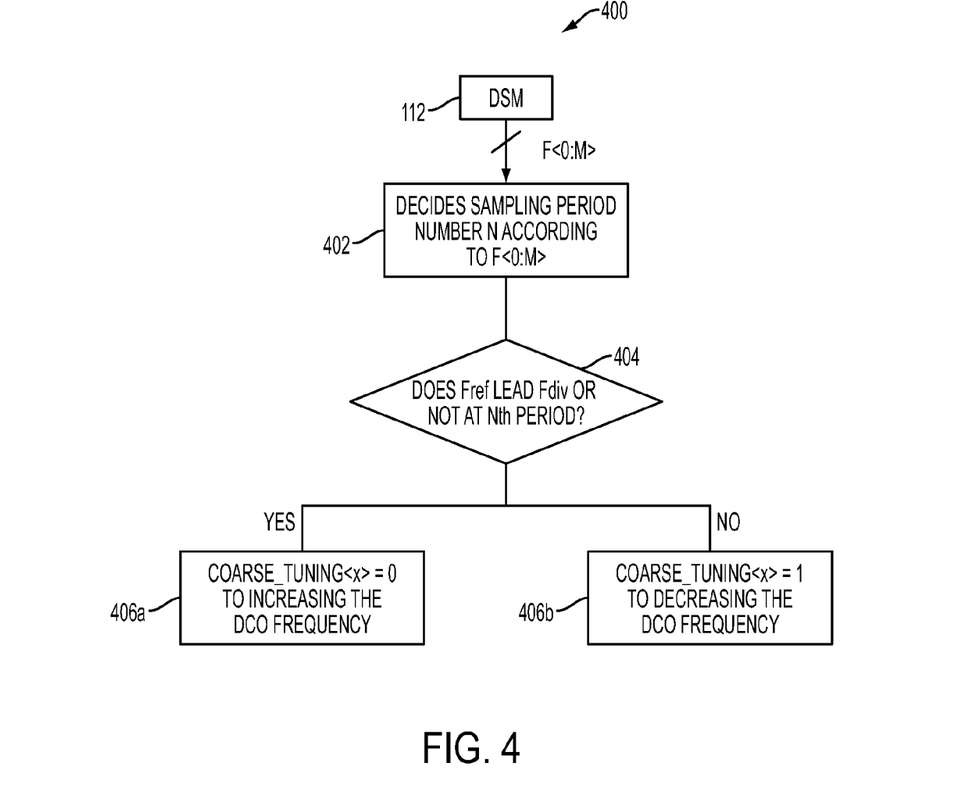
FIG. 4 is a flow chart for a determination of a coarse tuning signal output by a code generator, according to one or more embodiments.

FIG. 4 is a flow chart 400 for determining a value of the coarse tuning signal 107a output by a code generator (e.g. code generator 104). In operation 402, look-up table 214 determines sampling period N based on the fractional portion of the divisor ratio received from delta-sigma modulator 112. In some embodiments, look-up table 214 determines sampling period N based on the decision tree 300 of FIG. 3. In operation 404, code generator 104 determines if reference frequency Fref leads the divider frequency Fdiv at the sampling period N. In operation 406a, if reference frequency Fref leads divider frequency Fdiv at the sampling period N, code generator 104 outputs coarse tuning signal 107a equal to zero to increase the output frequency from VCO 108. In operation 406b, if reference frequency Fref does not lead divider frequency Fdiv at the sampling period N, code generator 104 outputs coarse tuning signal 107a having a high logical value which decreases the output frequency from VCO 108.

Following each output of the coarse tuning signal 107a, code generator 104 outputs the reset signal 107b to prepare PLL 100 for subsequent iterations of signal locking. In some embodiments, code generator 104 includes a reset signal generator. The reset signal generator is configured to receive the control signal 209. When the control signal 209 has a high logical value, the reset signal generator outputs the reset signal 107b.

Returning to FIG. 1, digital loop filter 106 is configured to receive the phase difference signal 103 and output the fine tuning signal 109. In some embodiments, digital loop filter 106 comprises a low pass filter. In some embodiments, digital loop filter 106 comprises a high pass filter. In some embodiments, digital loop filter 106 comprises a gain amplifier. Digital loop filter 106 is configured to have a smaller lock range than code generator 104. Lock range is the frequency range over which the PLL can lock the output frequency to the reference frequency Fref. By reducing the lock range of digital loop filter 106, locking time and stability of PLL 100 are increased. In some embodiments, digital loop filter 106 is deactivated while code generator 104 is in use. In some embodiments, digital loop filter 106 is activated after code generator 104 reduces a difference between the output frequency and the reference frequency Fref to a value within the lock range of digital loop filter 106. Once the output frequency is synchronized with the reference frequency Fref, digital loop filter 106 is used to compensate for subsequent fluctuations within the reference frequency Fref or the output frequency.

VCO 108 is configured to receive the coarse tuning signal 107a and the fine tuning signal 109 and output the output frequency signal 111 based on the coarse tuning signal 107a and the fine tuning signal 109. In some embodiments, VCO 108 is a relaxation oscillator. In some embodiments, VCO 108 is a digitally controlled oscillator (DCO). In some embodiments, VCO 108 comprises a capacitor. In some embodiments, VCO 108 comprises a trigger circuit such as a latch, a Schmitt trigger, a negative resistance element or other suitable circuit. VCO 108 is capable of changing a frequency of the output frequency signal 111 based on the coarse tuning signal 107*a* and the fine tuning signal 109. In some embodiments, a step size of the change in the frequency of the output frequency signal 111 based on the coarse tuning signal 107*a* is greater than a step size of the change in the frequency of the output frequency signal 111 based on the fine tuning signal 109.

Divider 110 is configured to receive the output frequency signal 111, the reset signal 107*b* and the divider number control signal. In some embodiments, divider 110 comprises a counter. Divider 110 is configured to divide the output frequency based on the divider number control signal F<0:4> and output the divider frequency Fdiv which is received by phase difference detector 102. Dividing the frequency output reduces the number of comparisons performed by PLL 100 in contrast to PLLs without a divider. The reduced number of comparisons facilitates smaller tuning steps, in contrast to PLLs without a divider, which in turn allow for more precise synchronization between the reference frequency Fref and the output frequency. The reset signal 107*b* from code generator 104 returns values stored in divider 110 to default values, e.g., sets a counting circuit to zero.

Delta-sigma modulator 112 is configured to receive the divisor ratio signal, N.F, where N is an integer component of the divisor ratio signal and F is a fractional component of the divisor ratio signal. Delta-sigma modulator 112 controls divider 110 by specifying a number of comparisons to be performed by PLL 100. Delta-sigma modulator 112 also provides the fraction component to code generator 104 to determine the sampling period. In some embodiments, delta-sigma modulator 112 is configured to dither the divider number to improve the phase noise performance of PLL 100. The reset signal 107*b* from code generator 104 causes the reset of values stored in delta-sigma modulator 112 to default values. In some embodiments, divisor ratio, N.F is selected by a user. In some embodiments, divisor ratio, N.F, is calculated based on a design of phase difference detector 102.

Figure 5:
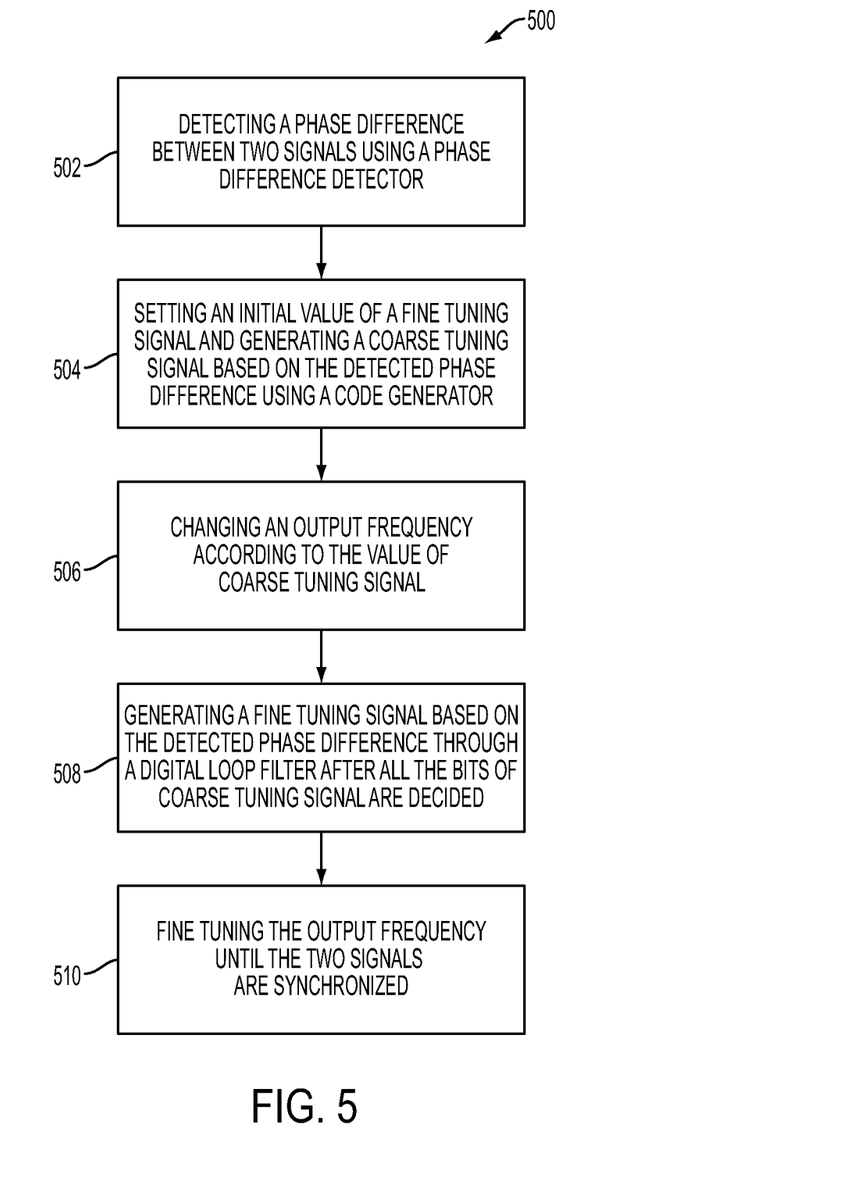
FIG. 5 is a flow chart of a method for using a PLL, according to one or more embodiments.

FIG. 5 is a flow chart of at least a portion of a method 500 for using a PLL (e.g. PLL 100). In operation 502, a phase difference between two signals is detected using a phase difference detector. The phase difference at the sampling period N is determined by phase difference detector 102 and transmitted to code generator 104 via the phase difference signal 103. The phase difference signal 103 is positive, if the reference frequency Fref leads the divider frequency Fdiv. The phase difference signal 103 is negative, if the divider frequency Fdiv leads the reference frequency Fref. Code generator 104 compares the phase difference signal 103 to zero at first comparator 202. The comparison result is transmitted to multiplexer 210.

In operation 504, an initial value of a fine tuning signal is set and a coarse tuning signal is generated based on the detected phase difference using a code generator. The initial value of the fine tuning signal is set using a divisor ratio. In some embodiments, the value of the divisor ratio is selected by a user. In some embodiments, the user inputs the divisor ratio using a man-machine interface such as a keyboard, a mouse or other suitable interface. In some embodiments, the value of the divisor ratio is calculated, using external circuitry, by dividing the reference frequency Fref by a comparator frequency. The comparator frequency is a rate at which phase difference detector 102 determines an offset between the reference frequency Fref and the divider frequency Fdiv.

The coarse tuning signal is generated based on the sampling period. The sampling period is determined based on a fractional value of the divisor ratio. In some embodiments, the sampling period is based on the five MSBs of the divisor ratio. In some embodiments, the sampling period is based on a different number of MSBs of the divisor ratio. In some embodiments, the sampling period is determined by delta-sigma modulator 112. In some embodiments, the sampling period is determined by code generator 104. In some embodiments, the sampling period is determined by second comparator 208. In some embodiments, the sampling period is determined using look up table 214 connected to second comparator 208.

Multiplexer 210 is configured to receive the comparison result and the sample signal 209 from second comparator 208. An output of multiplexer 210 is received by register 212 which generates the coarse tuning signal.

In operation 506, an output frequency is changed according to a value of the coarse tuning signal. A determination is made by multiplexer 210 whether to increase or decrease the frequency of a voltage controlled oscillator. If the phase difference at the sampling period is positive, register 212 outputs a low logic value for the coarse tuning signal 107*a* and the frequency of VCO 108 increases. If the phase difference at the sampling period is negative, register 212 outputs a high logic value for the coarse tuning signal 107*a* and the frequency of VCO 108 decreases. Following output of the coarse tuning signal 107*a*, code generator 104 outputs the reset signal 107*b* to reset divider 110, delta-sigma modulator 112 and counter 206 to default values.

In operation 508, a fine tuning signal is generated based on the detected phase difference through a digital loop filter after all the bits of coarse tuning signal are decided. Fine tuning is performed using digital loop filter 106. Digital loop filter 106 has a smaller lock range than code generator 104. In some embodiments, digital loop filter 106 has a smaller step size than code generator 104. During fine tuning, digital loop filter 106 is used to compensate for fluctuations in the reference frequency Fref and other variances within PLL 100 to facilitate locking between the reference frequency Fref and the output reference.

In operation 510, the output frequency is fine tuned until the two signals are synchronized.

One aspect of the present description relates to a phase locked loop. The phase locked loop includes a phase difference detector configured to receive a reference frequency and a divider frequency, the phase different detector configured to output a phase difference signal. The phase locked loop further includes a code generator configured to receive the reference frequency and the phase difference signal, the code generator configured to output a coarse tuning signal and a reset signal. The phase locked loop further includes a digital loop filter configured to receive the phase difference signal, the digital loop filter configured to output a fine tuning signal. The phase locked loop further includes a voltage control oscillator configured to receive the coarse tuning signal and the fine tuning signal, the voltage control oscillator configured to output an output frequency. The phase locked loop further includes a divider configured to receive the reset signal, a divider number control signal and a feedback from the output frequency, the divider configured to output the divider frequency. The phase locked loop further includes a delta-sigma modulator configured to receive a divisor ratio and the reset signal.

Another aspect of the present description relates to a method of synchronizing two signals. The method including detecting a phase difference between two signals using a phase difference detector. The method further including generating a coarse tuning signal based on the detected phase difference using a code generator. The method further including generating a fine tuning signal based on the detected phase difference using a digital loop filter. The method further including changing a frequency of an output frequency based on at least one of the coarse tuning signal and the fine tuning signal using a voltage control oscillator.

Still another aspect of the present description relates to a semiconductor device configured to receive a signal from an external device. The semiconductor device including a phase locked loop. The phase locked loop includes a phase difference detector configured to receive a reference frequency from the external device and a divider frequency, the phase different detector configured to output a phase difference signal. The phase locked loop further includes a code generator configured to receive the reference frequency and the phase difference signal, the code generator configured to output a coarse tuning signal and a reset signal. The phase locked loop further includes a digital loop filter configured to receive the phase difference signal, the digital loop filter configured to output a fine tuning signal. The phase locked loop further includes a voltage control oscillator configured to receive the coarse tuning signal and the fine tuning signal, the voltage control oscillator configured to output an output frequency. The phase locked loop further includes a divider configured to receive the reset signal, a divider number control signal and a feedback from the output frequency, the divider configured to output the divider frequency. The phase locked loop further includes a delta-sigma modulator configured to receive a divisor ratio and the reset signal.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A phase locked loop (PLL) comprising:
    a phase difference detector configured to receive a reference frequency and a divider frequency, the phase difference detector configured to output a phase difference signal;
    a code generator configured to receive the reference frequency and the phase difference signal, the code generator configured to output a coarse tuning signal and a reset signal;
    a digital loop filter configured to receive the phase difference signal, the digital loop filter configured to output a fine tuning signal;
    a voltage control oscillator configured to receive the coarse tuning signal and the fine tuning signal, the voltage control oscillator configured to output an output frequency;
    a divider configured to receive the reset signal, a divider number control signal and a feedback from the output frequency, the divider configured to output the divider frequency; and
    a delta-sigma modulator configured to receive a divisor ratio and the reset signal.

2. The PLL of claim 1, wherein the phase difference detector comprises a time-to-digital converter (TDC) circuit.

3. The PLL of claim 1, wherein the phase difference detector comprises a time-to-current converter (TCC) circuit and an analog-to-digital converter (ADC) circuit.

4. The PLL of claim 1, wherein the code generator is configured to receive M most significant bits (MSBs) of a fractional portion of the divisor ratio, determine a sampling period based on the M MSBs, and generate the coarse tuning signal based on a phase difference at the sampling period.

5. The PLL of claim 1, wherein the voltage control oscillator comprises a digital control oscillator.

6. The method of claim 1, wherein the code generator is configured to output the reset signal after the coarse tuning signal is output.

7. A method of synchronizing two signals, the method comprising:
    detecting a phase difference between two signals using a phase difference detector;
    setting an initial value of fine tuning signal and generating a coarse tuning signal based on the detected phase difference using a code generator;
    changing an output frequency of a voltage control oscillator according to the value of coarse tuning signal;
    generating a fine tuning signal based on the detected phase difference through a digital loop filter after all the bits of coarse tuning signal are decided; and
    fine tuning the output frequency until the two signals are synchronized.

8. The method of claim 7, wherein the generating the coarse tuning signal comprises:
    determining a sampling period N according to a fractional portion of a divisor ratio;
    detecting the phase difference at the Nth sampling period; and
    outputting the coarse tuning signal based on the value of phase difference at the Nth sampling period.

9. The method of claim 8, wherein the determining the sampling period comprises using M most significant bits (MSBs) of the fractional portion of the divisor ratio, where M is less than or equal to a total number of bits of the fraction portion and a fine tuning frequency range is greater than $2^{-M}*\text{Fref}$.

10. The method of claim 8, further comprising:
    adjusting the frequency of the output frequency based on the phase difference at the sample period.

11. The method of claim 7, wherein the detecting the phase difference between two signals comprises detecting a phase difference between a reference frequency and a divider frequency.

12. The method of claim 11, further comprising generating the divider frequency using a divider based on a feedback of the output frequency and divider number N.f.

13. The method of claim 7, further comprising the generating the fine tuning signal and the changing the frequency of the output frequency based on the fine tuning signal after a predetermined number of repetitions of the detecting the phase difference, generating the coarse tuning signal, and changing the frequency of the output frequency based on the coarse tuning signal.

14. The method of claim 13, further comprising generating a reset signal using the code generator following each of the predetermined number of repetitions.

15. A semiconductor device, wherein the semiconductor device is configured to receive a signal and the semiconductor device comprises:
    a phase locked loop (PLL) comprising:
        a phase difference detector configured to receive a reference frequency from the external device and a divider frequency, the phase difference detector configured to output a phase difference signal;
        a code generator configured to receive the reference frequency and the phase difference signal, the code generator configured to output a coarse tuning signal and a reset signal;

a digital loop filter configured to receive the phase difference signal, the digital loop filter configured to output a fine tuning signal;

a voltage control oscillator configured to receive the coarse tuning signal and the fine tuning signal, the voltage control oscillator configured to output an output frequency;

a divider configured to receive the reset signal, a divider number control signal and a feedback from the output frequency, the divider configured to output the divider frequency; and a delta-sigma modulator configured to receive a divisor ratio and the reset signal, the delta-sigma modulator configured to output parts of the fractional number to code generator for determining the sampling period number N.

16. The semiconductor device of claim 15, wherein the phase difference detector comprises a time-to-digital converter (TDC) circuit.

17. The semiconductor device of claim 15, wherein the phase difference detector comprises a time-to-current converter (TCC) circuit and an analog-to-digital converter (ADC) circuit.

18. The semiconductor device of claim 15, wherein the code generator is configured to receive M most significant bits (MSBs) from a fractional portion of the divisor ratio, determine a sampling period based on the M MSBs, and generate the coarse tuning signal based on a phase difference at the sampling period.

19. The semiconductor of claim 15, wherein the voltage control oscillator comprises a digital control oscillator.

20. The semiconductor device of claim 15, wherein the semiconductor device comprises at least one of a radio transceiver, a clock multiplier or a microprocessor.

* * * * *